United States Patent [19]

Sato et al.

[11] 4,446,355
[45] May 1, 1984

[54] CROSSOVER CONSTRUCTION OF THERMAL-HEAD AND METHOD OF MANUFACTURING SAME

[75] Inventors: Kiyoshi Sato; Minoru Terashima, both of Kawasaki; Haruo Sorimachi, Yokohama; Toshiaki Naka, Machida; Takeo Kanno, Suzaka; Fumiaki Yamada, Yokohama, all of Japan

[73] Assignee: Fujitsu Limited, Kawasaki, Japan

[21] Appl. No.: 351,284

[22] Filed: Feb. 22, 1982

[30] Foreign Application Priority Data

Feb. 23, 1981 [JP] Japan .................. 56-24212

[51] Int. Cl.$^3$ .............. H05B 3/00; G01D 15/10; B41J 3/20
[52] U.S. Cl. .................. 219/216; 219/543; 346/76 PH; 400/120; 29/611; 29/620; 338/308
[58] Field of Search .................. 219/216, 543; 346/76 PH; 338/307, 308, 309; 29/611, 620, 621; 400/120; 101/93.04

[56] References Cited

U.S. PATENT DOCUMENTS

| 3,609,294 | 9/1981 | Cady | 219/216 |
| 4,017,712 | 4/1977 | Baraff | 219/216 |
| 4,031,272 | 6/1977 | Khanna | 338/308 |
| 4,099,046 | 7/1978 | Boynton | 219/216 |
| 4,241,103 | 12/1980 | Ohkubo | 219/216 |
| 4,250,375 | 2/1981 | Tsutsumi | 219/543 |
| 4,252,991 | 2/1981 | Iwabushi | 219/216 |

FOREIGN PATENT DOCUMENTS 2331536 1/1974 Fed. Rep. of Germany .
2758280 10/1978 Fed. Rep. of Germany .

OTHER PUBLICATIONS

Acheson Electrodag +504, Product Data Sheet, GPH 1310.504, General Purpose High Temperature Silver Conductive Coating.
Acheson Electrodag •, Product Data Sheet, GPH 1310.500, High Temperature Insulating Base Coating.

Primary Examiner—Roy N. Envall, Jr.
Assistant Examiner—Teresa J. Walberg
Attorney, Agent, or Firm—Staas & Halsey

[57] ABSTRACT

A crossover construction of a thermal-head is which the thermal-head comprises: a substrate of insulating material; a plurality of heat elements disposed side by side in one row on said substrate; a plurality of lower thin film conductor patterns each of which connects to each of said heat elements and extends in direction X; an insulating layer disposed over said lower conductors; a plurality of upper conductor patterns disposed in parallel in another direction Y on said insulating layer so as to form a crossover on said substrate, said upper and lower conductors being selectively connected together through openings of said insulating layer, wherein said insulating layer and said upper conductors comprise printed and cured paste of insulating material and conductive material, respectively, each paste being of the low temperature curing type which can be cured at a temperature low enough not to affect the resistance of said thin film lower conductors, and a metallic layer of low resistance is coated on each of said upper conductors.

10 Claims, 13 Drawing Figures

CROSSOVER CONSTRUCTION OF THERMAL-HEAD AND METHOD OF MANUFACTURING SAME

FIELD OF THE INVENTION

The present invention relates to a pattern manufacturing method of a thermal-head of a thermal printer, more particularly, to the crossover construction of the thermal-head and a method of manufacturing the same.

BACKGROUND OF THE INVENTION

A number of heat generative resistances (heat elements) are disposed on a thermal-head substrate at a high density (6 to 10 dots/mm). The pattern electrically connecting such resistances must be formed by the thin film method. The thin film method is as follows. First, a conductive film is coated over a substrate by the method of vaporization or sputter of a metal. Then, a resist agent is coated over this metallic film. The resist is exposed through a mask having openings corresponding to the pattern to be made. The resist is then developed and forms the desired shape of pattern on the metallic film. After that, the metallic film is etched so that the desired pattern of the conductive film is formed in the substrate. Such a thin film method is suitable for forming minute patterns. However, it involves many processing steps and requires much time, labor, and expense.

Another method for forming a conductive pattern on the substrate is the thick film method. In the thick film method, a conductive paste including pulverulent metal is printed on the substrate in the form of the desired pattern through a screen of the pattern to be made. The printed paste is heated or cured so that the desired conductive pattern is obtained. Compared with the thin film method, the thick film method features fewer processing steps and requires less time and labor since the resist coating, exposure, development, and etching processes are unnecessary. However, the thick film method suffers from problems concerning pinholes, curing temperature, resistance of the produced conductive pattern, and density of the pattern.

The crossover portion of the thermal-head comprises lower conductors which connect to the heat generative resistances and upper conductors which are disposed over the lower conductor through an insulating layer. In the conventional method of forming the crossover, the upper conductors are formed by the thin film method, due to reasons described later. Therefore, much time and labor have been required, which has caused low productivity and high costs.

Another conventional method of forming the crossover is to prepare a printed board or a chip, on which the crossover portion is formed, separately from the thermal-head substrate. This allows any convenient heat generative process to be utilized to form the crossover since the conductive pattern on the substrate is not affected by the heat during the crossover manufacturing process. However, such a separate printed board or chip must be connected to the lower conductor of the substrate by the wire bonding method. Such wire bonding between minute patterns is very troublesome and reliability is low.

OBJECT OF THE INVENTION

An object of the present invention is to provide a crossover construction of a thermal-head, in which productivity is enhanced by decreasing the number of manufacturing processes and in which reliable connection between upper and lower conductors can be obtained, while reliable insulation therebetween is maintained at the portion to be insulated.

SUMMARY OF THE INVENTION

The present invention discloses a crossover construction of a thermal-head, in which the thermal-head comprises: a substrate of insulating material; a plurality of heat elements disposed side by side in one row on said substrate; a plurality of lower thin film conductor patterns each of which connects to each of said heat elements and extends in direction X; an insulating layer disposed over said lower conductors; a plurality of upper conductor patterns disposed in parallel in another direction Y on said insulating layer so as to form a crossover on said substrate, said upper and lower conductors being selectively connected together through openings of said insulating layer, characterized in that said insulating layer and said upper conductors comprise printed and cured insulating paste and conductor paste, respectively, each paste being of a low temperature curing type which can be cured at a temperature low enough not to affect the resistance of said thin film conductors, and that a metallic layer of low resistance is coated on each of said upper conductors.

BRIEF DESCRIPTION OF THE DRAWINGS

The present invention will be described with reference to the drawings in contrast to the prior art, wherein.

DETAILED DESCRIPTION OF THE INVENTION

Figure 1:
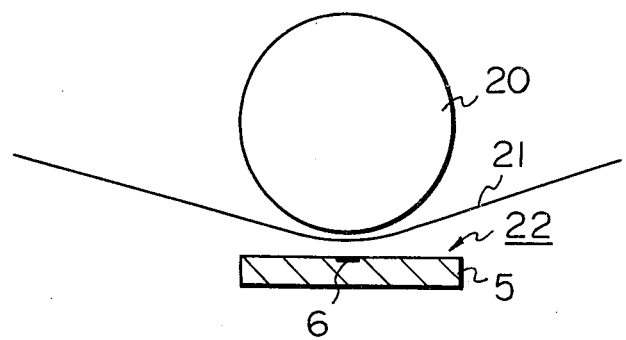
FIG. 1 is a diagramatical view of a thermal printer.

A thermal printer utilized in a facsimile system comprises a cylindrical platen 20 and a thermal-head 22 facing the platen 20 through heat sensitive paper 21, as illustrated in FIG. 1. The thermal-head 22 comprises a substrate 5 of, for example, ceramic and a plurality of heat elements 6 disposed side by side in one row on the substrate 5 (FIG. 2).

Figure 2:
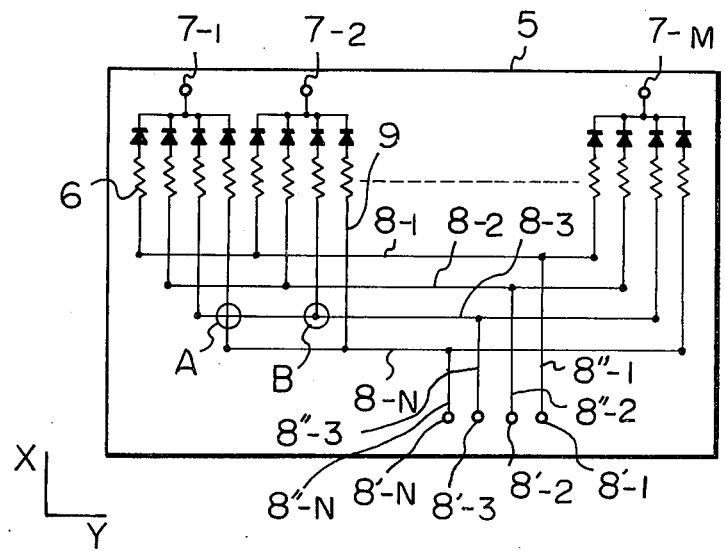
FIG. 2 is a plan view of a thermal-head showing a matrix circuit pattern formed thereon.

A matrix circuit pattern as illustrated in FIG. 2 is formed on the substrate 5. The heat elements 6 are divided into M groups 7-1 through 7-M. Each group comprises N heat elements 6. In this embodiment, N is four. Each of select lines 8-1 through 8-N connects every one of heat elements 6 of every group together through lead lines 9. One of group terminals 7-1 through 7-M and one or more of select terminals 8'-1 through 8'-N are selected and fed current so that the desired heat elements 6 are energized. The select lines 8-1 through 8-N cross over the lead lines 9.

Such a matrix circuit pattern is formed as follows. First, lead lines 9, each of which connect to each heat element 6 on the substrate 5, are formed by a thin film method so as to extend in the same direction as that of each heat element 6 (direction X). Lead lines 8''-1 through 8''-N which connect to lead terminals 8'-1 through 8'-N, respectively, are formed simultaneously with lead lines 9. An insulating layer is then coated over the lead lines 9 and 8''-1 through 8''-N. After that, select lines 8-1 through 8-N are formed in the transverse direction (direction Y) over the insulating layer. At the cross point A, the lower conductor (lead line) 9 and the upper conductor (select line) 8 are isolated from each other by an insulating layer. At the cross point B, the lower conductor 9 and the upper conductor 8 are connected together through a through-hole formed in the insulating layer. Other cross points are similar to either cross point A or B.

Figure 3:
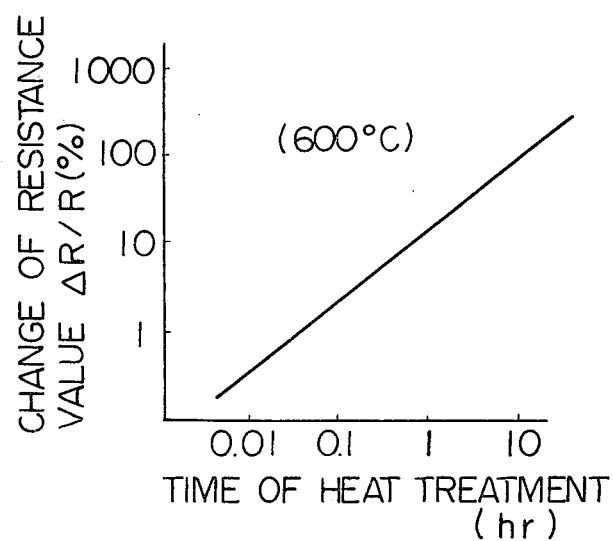
FIG. 3 is a graphical view representing the change of resistance value of a thin film conductor with respect to time of heat treatment at 600° C.

The conventional thick film method cannot be used for forming the upper conductor 8 for the following reason. In the conventional thick film method, about ten hours of curing time is required at a temperature of 500° C. through 900° C. after printing the paste of conductor through the screen. The heat of curing of the upper conductor affects the resistance value of the lower conductor, as shown in FIG. 3, which represents the case when the curing temperature is 600° C. After 10 hours of curing time, the resistance value changes 100%, i.e., the resistance value becomes twice that of the original value. Such a large increase of resistance value is unacceptable for the thermal-head.

Figure 4:
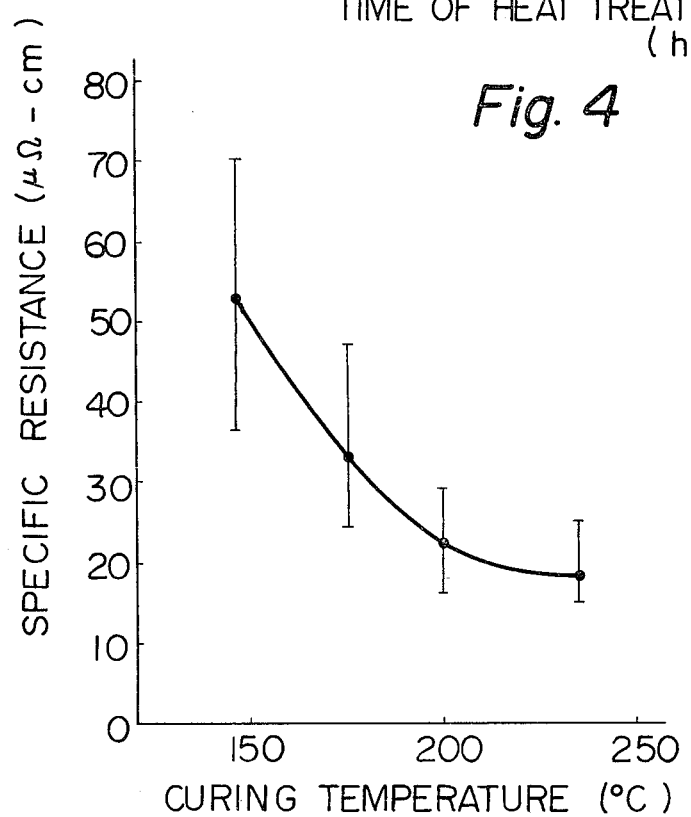
FIG. 4 is a graphical view representing the change of specific resistance of a low temperature curing type thick film conductor paste with respect to curing temperature.

On the other hand, thick film paste of a low temperature curing type which can be cured at a temperature of 150° C. through 250° C. has been realized. Such a low temperature curing type paste, however, cannot be applied to form the upper conductor of the thermal-head since the resistance of the paste is too large, as can be seen from FIG. 4 which shows that the specific resistance of the paste is more than 20 $\mu\Omega\cdot$cm. If the curing temperature is raised more, the lower conductor is oxidized, causing an increase of resistance. Therefore, no one has thought of using this low temperature curing type thick film paste for forming the upper conductor of the thermal-head.

The present invention makes it possible to apply such a low temperature curing type thick film paste to form the upper conductors of the thermal-head.

Figure 5:
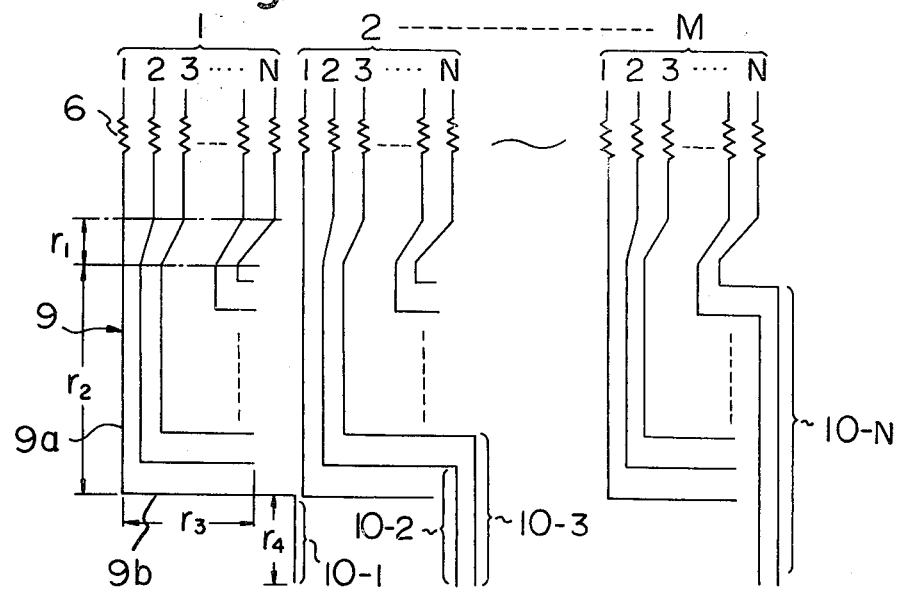
FIGS. 5 through 7 are plan views of a thermal-head, each of which represents a crossover portion at a different manufacturing step.
Figure 6:
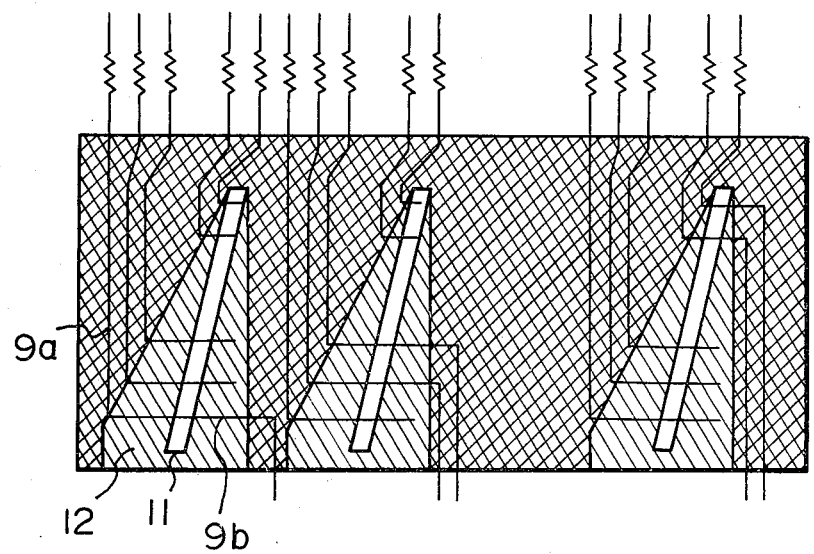
Figure 7:
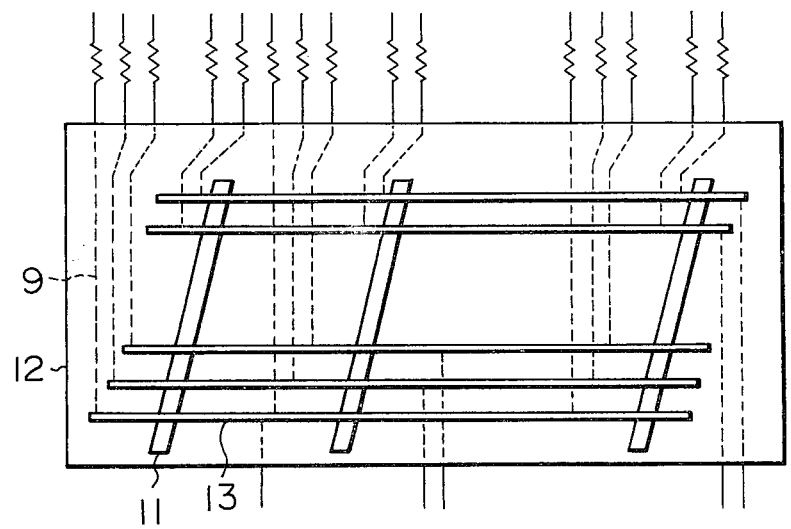

An example of the manufacturing method of a crossover of the thermal-head according to the present invention is shown in FIGS. 5 through 7. In FIG. 5, lower thin film conductor patterns 9 (lead lines from the heat elements 6) are illustrated. The heat elements 6 are divided into M groups 6-1 through 6-M. Each of the M groups comprises N heat elements 6. Each of the lower conductors 9 is formed in an L shape comprising a first conductor 9a in direction X and a second conductor 9b in direction Y. The resistances of the conductors connected to the heat elements 6 are uniformly arranged as follows. Every L-shaped conductor 9 has a different resistance comprising resistances $r_1$, $r_2$, and $r_3$. The resistance $R_1$ of the first L-shaped conductor is represented as $R_1 = r_{1-1} + r_{2-1} + r_{3-1}$, while the resistance of the Nth conductor is represented as $R_N = r_{1-N} + r_{2-N} + r_{3-N}$. The difference between $R_1$ and $R_N$ can be compensated by adding resistance $r_4$ of the lead line 10 to the select terminal (not shown in this drawing) so that the compensated resistance value $R'_1 (= r_{1-1} + r_{2-1} + r_{3-1} + r_{4-1})$ is equal to the compensated resistance value $R'_N (= r_{1-N} + r_{2-N} + r_{3-N} + r_{4-N})$. Each first L-shaped conductor of each group is connected together through the upper conductor of low resistance (not shown in this drawing). Similarly, each corresponding L-shaped conductor of each group is connected together through the upper conductor.

After forming the lower conductors 9, 10 on the substrate, an insulating layer 12 is coated over the lower conductors as shown in FIG. 6. The insulating layer 12 has openings 11 for contacting the lower conductors and the upper conductors. The insulating layer 12 is formed by the method of printing paste through a screen. The paste is of the type which can be cured at a temperature below 250° C. The printing process is conducted twice. First, bottom right hatched portion, including the cross-hatched portion, is printed with the low temperature curing type paste through a screen having mask pattern of the opening 11. After the first printed paste is heated and cured, a second printing is conducted over the cross-hatched portion. In this second layer, openings are formed to be triangular and wider than the first opening 11 in order to avoid a large difference in level at the insulating layer edges at the openings 11. Such longitudinal parallelograms and triangular shapes are easy to print. By repeating the coating of the insulation paste twice, breakage of insulation due to pinholes is reliably avoided. Therefore, the first conductors 9a in direction X should be covered under this double coated layer so as to be reliably isolated from the upper conductors, which are to be printed over this insulation layer 12. The second conductors 9b in direction Y may be coated only once since they are to be connected to the upper conductors and it does not matter if pinholes are formed in this portion.

After that, straight upper conductors 13 are formed in parallel as illustrated in FIG. 7. The upper conductors 13 are formed by the thick film method using conductor paste which can be cured at a temperature below 250° C. The upper conductors 13 contact the lower conductors 9b in direction Y at the opening 11. Such straight conductors 13 can be conveniently printed and easily aligned with the lower conductors 9b. After the upper conductors 13 are cured, a metallic layer of low resistance is formed on each upper conductor 13 by plating or dipping in solder.

Figure 8:
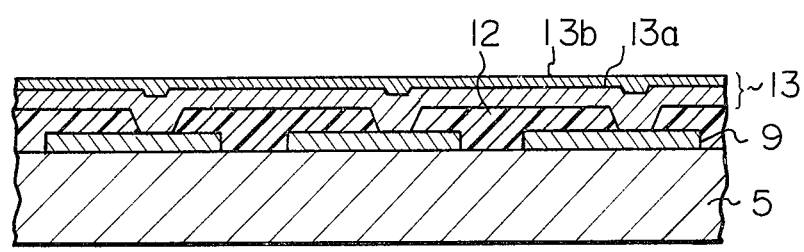
FIG. 8 is a sectional view of the crossover portion of the present invention.

A cross-section of the crossover portion is illustrated in FIG. 8. The crossover portion comprises the substrate 5, lower conductor 9, the insulation layer 12, and the upper conductor 13. The upper conductor 13 comprises a thick film conductor 13a made of low temperature curing type paste and a metallic layer 13b of low resistance.

Figure 9:
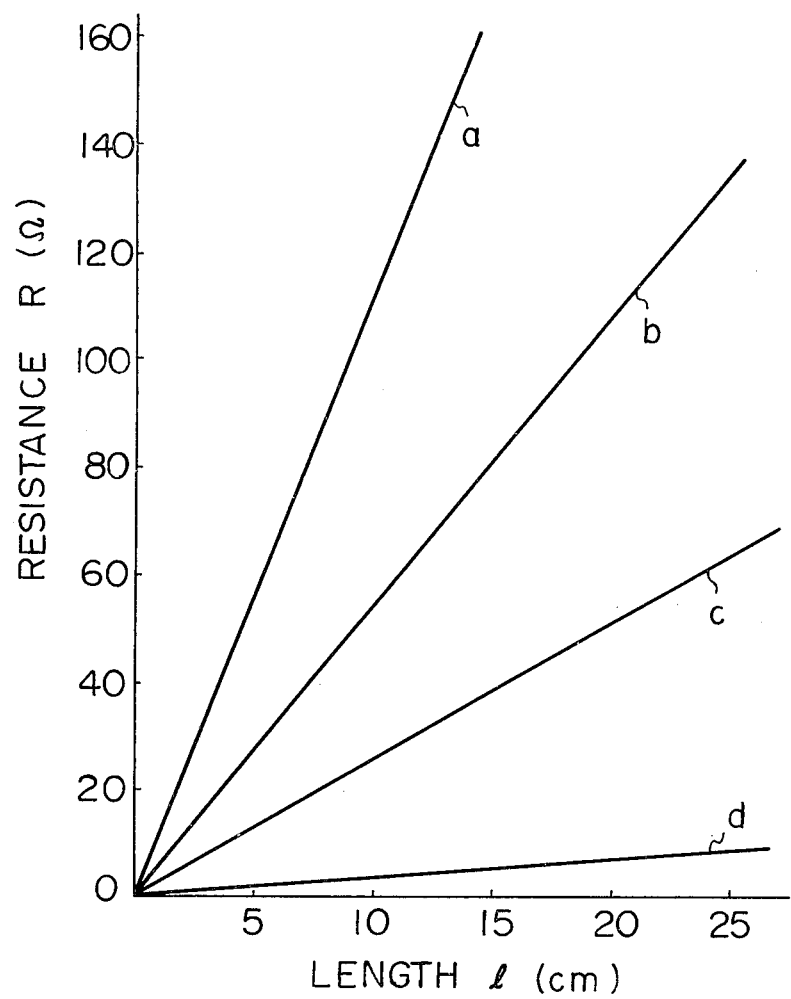
FIG. 9 is a graphical view representing the resistance value of an upper conductor of thick film paste with respect to its length.

FIG. 9 is a graphical view of the resistance value of the upper conductor with respect to its length, when the upper conductor comprises the conductor paste of the type which can be cured at low temperature. Line a represents a conductor of 0.1 mm width and 100 mΩ/☐ sheet resistance. Line b represents a conductor of 0.1 mm width and 50 mΩ/☐ sheet resistance (or 0.2 mm width and 100 mΩ/☐ sheet resistance). Line c represents a conductor of 0.2 mm width and 50 mΩ/☐ sheet resistance. Each of the conductors a, b, c is of 20 μm thickness and composed of only thick film conductor paste of the low temperature curing type and without metallic coating thereon. Line d represents a conductor comprising metallic coating of gold (Au) of 3 μm thickness on the conductor of a, b, or c. The resistance of the heat element is 5 through 500Ω. The resistance of the conductor to be connected to the heat element must be less than 5% of the resistance of the heat element. When the conductor is composed of only thick film conductor paste of the low temperature curing type, the resistance is about 50Ω when the length is 20 cm, even in the conductor of c which has the lowest resistance. Therefore, neither conductor a, b, or c can be applied to the thermal-head. The inventors' opinion is that when the density of the upper conductors is more than 1 through 2 lines/mm, a conductor composed of only thick film paste cannot be utilized in the thermal-head.

The present invention makes it possible to apply such a thick film paste to the thermal-head by coating metal, preferably gold, on the upper conductor of thick film paste so as to lower the resistance of the upper conductor. Such metallic coating can be easily done by electrolytic plating of metal since the base of the pattern to be plated is already formed with conductive material, which can be used as an electrode during the plating process. Therefore, no etching process for shaping patterns is necessary.

Figure 10:
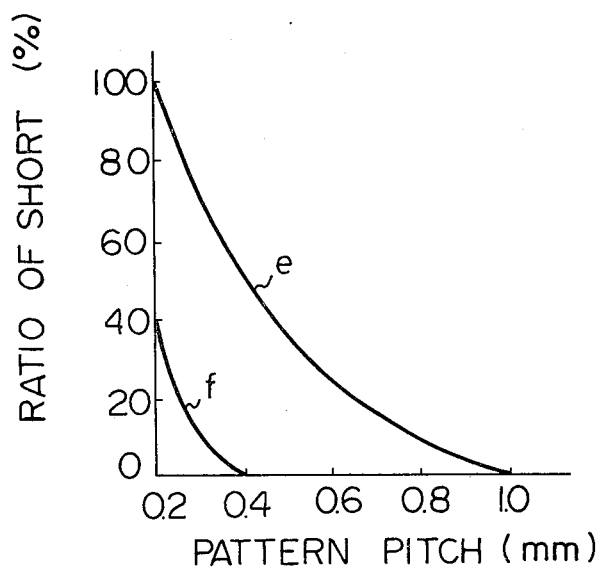
FIG. 10 is a graphical view representing the rate of occurrence of short-circuits between two adjacent upper conductors with respect to the pitch thereof.
Figure 11:
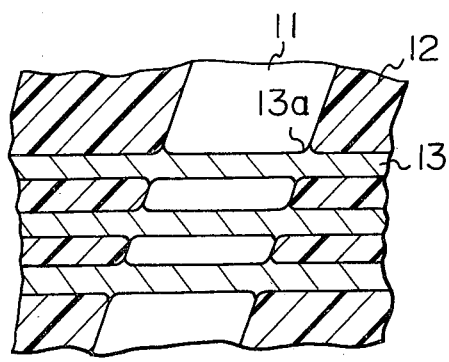
FIG. 11 is a partial enlarged view of upper conductors of the present invention.

According to the present invention, the upper and lower conductors are connected along the line which extends in direction Y, instead of connecting them at their crosspoint as in the case of prior art. Therefore, the upper and lower conductors are reliably connected to each other and the opening of the insulation layer can be easily disposed at the connection position. The opening has an elongated shape. When the conductor paste is printed through the screen, enlarged portions 13a (see FIG. 11) are formed at the edges of the opening 11 of the insulating layer 12. The size of such enlarged portions is small if the edges of the opening 11 are inclined with respect to the printing direction of the upper conductors 13 (direction Y), thereby it is possible to avoid short-circuits between two adjacent conductors 13. FIG. 10 is a graphical view representing the rate of occurrence of such a short-circuit with respect to the pitch of the conductors. Line e represents the case in which the edges of the opening are perpendicular to the upper conductor. Line f represents the case in which the edges of the opening are inclined with respect to the upper conductor.

Uniformity of resistances of conductors connected to the heat elements can be achieved by adjusting the length, width, and location of each lead line 10 (FIG. 5), thereby avoiding unevenness of printing density by the heat element.

Figure 12:
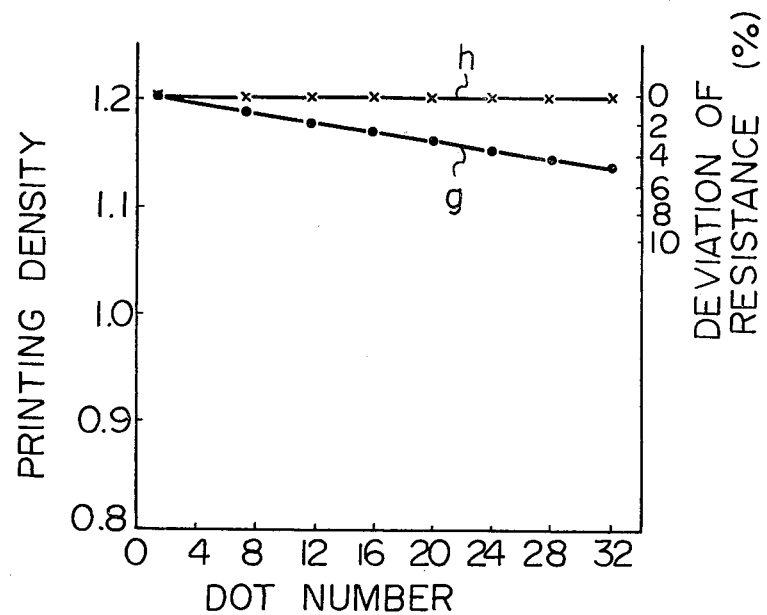
FIG. 12 is a graphical view representing the density of printed characters with respect to the position of the heat element.

FIG. 12 is a graphical view representing the printing density of each dot (heat element) of a printer which has 32 dots. Line g represents unevenness of printing density in which the density is decreased due to increase of resistance when the dot number is increased. Line h represents uniform printing density of dots due to uniformity of resistance of the conductor which leads to each dot.

Figure 13:
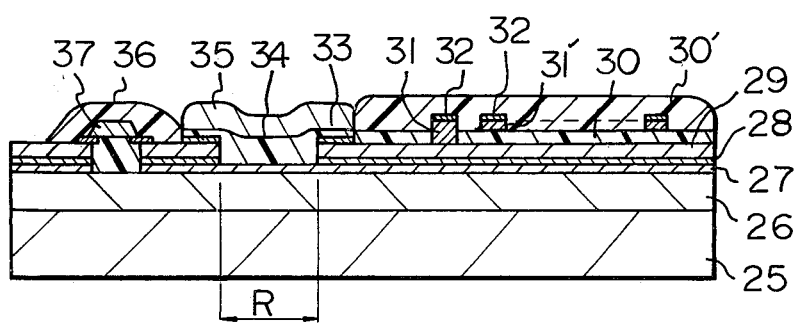
FIG. 13 is a sectional view of a thermal-head of the present invention.

A thermal-head according to the present invention is illustrated in cross-section in FIG. 13. A glazed layer 26 is formed on a substrate 25 of alumina. A resistance film 27 of nitric tantalum is coated on the glazed layer 26. Reference numeral 29 designates a lower conductor layer of gold formed by the thin film method. Reference numeral 28 designates a layer of nickelic chromium (NiCr) for firm adhesion of the gold layer 29 and the resistance layer 27. The uncovered portion R of the resistance layer 27 constitutes a heat element. Reference numerals 31 and 31' designate upper conductors made by curing the printed paste of the low temperature curing type. Each of the upper conductors 31, 31' is coated with a layer 32 of gold. It is preferable that the surface of the upper conductors 31, 31' are nickel plated before coating with gold in order to avoid diffusion of silver contained within the conductor paste into the layer 32 of gold. Reference numeral 30 designates an insulating layer made by curing the printed insulation paste of the low temperature curing type. Reference numeral 30' designates an overcoat for protecting the crossover surface. The overcoat 30' may be made of the same material as the material of the insulating layer 30. The heat element R is covered with a protective layer 34 of silicone dioxide ($SiO_2$). A film 33 of chromium (Cr) is disposed between the protective layer 34 of $SiO_2$ and the lower conductor 29 of gold for combining the protective layer 34 and the layer 29 of gold. The layer 34 of $SiO_2$ is covered with a protective overcoat 35 against damage due to friction between the paper and the thermal head. A diode 37 is covered with silicone resin 36.

The following commercial products can be utilized as the insulation paste of the low temperature curing type: #1109-I, for bonding silicone chips, by ESL Co., curing condition 180° C. through 220° C., 1 to 2 hours; or CR-30, for overcoat of thick film IC, by Asahi Chemical Co., curing condition 150° C., 30 minutes.

The following commercial products can be utilized as the conductive paste of the low temperature curing type: #1109-S, for bonding silicone chips, by ESL Co., conductive powder of silver, specific resistance 40 to $80 \times 10^{-4}$ Ω·cm, curing condition 180° C. through 220° C., 1 to 2 hours; #1110-S, for bonding silicone chips, by ESL Co., conductive powder of silver, specific resistance 20 to $60 \times 10^{-6}$ Ω·cm, curing condition 180° C. through 220° C., 1 to 2 hours; or 4929, by DuPont Co., conductive powder of silver, specific resistance below $10^{-4}$ Ω·cm, curing condition 100° C., 1 hour.

When the silver is included as the conductive powder, it is preferable to use paste which has a specific resistance of below $6 \times 10^{-5}$ Ω·cm since metallic plating thereon can be easily and reliably achieved.

In the present invention, the above-mentioned paste of the low temperature curing type is utilized for forming the insulation layer and the upper conductor by printing it through a screen. Therefore, the number of processes for forming the crossover is decreased, as mentioned in the beginning, thereby enhancing productivity.

We claim:
1. A crossover construction of a thermal-head in which the thermal-head comprises:
   (a) a substrate of insulating material;

(b) a plurality of heat elements disposed side by side in one row on said substrate;

(c) a plurality of lower thin film conductor patterns, each of which connects to each of said heat elements and extends in direction X;

(d) an insulating layer disposed over said lower conductors;

(e) plurality of upper conductor patterns disposed in parallel in another direction Y on said insulating layer so as to form a crossover on said substrate, wherein said upper and lower conductors are selectively connected together through openings of said insulating layer, and wherein said insulating layer and said upper conductors comprise printed and cured paste of insulating material and conductive material, respectively, each paste being of the low temperature curing type which can be cured at a temperature low enough not to affect the resistance of said thin film lower conductors; and (f) a metallic layer of low resistance coated on each of said upper conductors.

2. A crossover construction according to claim 1, in which each of said lower conductors has a contacting portion extending in direction Y so as to contact said upper conductor.

3. A crossover construction according to claim 2, in which said insulating layer has a plurality of parallelogram-shaped longitudinal openings each of which includes at least two of said contacting portions.

4. A crossover construction according to claim 3, in which the longitudinal edges of said opening are inclined with respect to direction Y.

5. A crossover construction according to claim 1, in which said conductive paste includes powder of silver as a conductor.

6. A crossover construction according to claim 5, in which said upper conductor comprises a nickel plated layer between said conductor paste and said metallic coating thereon so as to avoid diffusion of silver into said metallic coating.

7. A crossover construction according to claim 6, in which said metallic coating is made of gold.

8. A crossover construction according to claim 1, in which the density of said upper conductors is more than one line/mm.

9. A method of manufacturing a crossover of a thermal-head in which the thermal-head has a substrate of insulating material; a plurality of heat elements disposed side by side in one row on said substrate; a plurality of lower thin film conductor patterns each of which connects to each of said heat elements and extends in direction X; an insulating layer disposed over said lower conductors; and a plurality of upper conductor patterns disposed in parallel in another direction Y on said insulating layer so as to form a crossover on said substrate, said upper and lower conductors being selectively connected together through openings of said insulating layer, wherein the process comprises the steps of: (a) forming said insulating layer and said upper conductors by printing and curing paste of insulating material and conductive material, respectively, each paste being of the low temperature curing type which can be cured at a temperature low enough not to affect the resistance of said thin film lower conductors, and (b) after curing said upper conductors of paste, coating a metallic layer of low resistance on each of said upper conductors.

10. A method of manufacturing a crossover according to claim 9, in which the process of printing and curing said insulating layer is repeated at least twice.

* * * * *

UNITED STATES PATENT AND TRADEMARK OFFICE
CERTIFICATE OF CORRECTION

PATENT NO. : 4,446,355
DATED : May 1, 1984
INVENTOR(S) : KIYOSHI SATO ET AL.

It is certified that error appears in the above-identified patent and that said Letters Patent is hereby corrected as shown below:

Front Page (56)

"3,609,294 9/1981" s/b --3,609,294 9/1971--.
"Electrodag ." s/b --Electrodag +500--.

Abstract (57)

Line 1, change "is" to --in--.

Signed and Sealed this

Twenty-fifth Day of September 1984

[SEAL]

Attest:

Attesting Officer

GERALD J. MOSSINGHOFF

Commissioner of Patents and Trademarks